United States Patent [19]

Ema

[11] Patent Number: 5,014,103
[45] Date of Patent: May 7, 1991

[54] DYNAMIC RANDOM ACCESS MEMORY HAVING IMPROVED LAYOUT AND METHOD OF ARRANGING MEMORY CELL PATTERN OF THE DYNAMIC RANDOM ACCESS MEMORY

[75] Inventor: Taiji Ema, Kawasaki, Japan

[73] Assignee: Fujitsu Limited, Kanagawa, Japan

[21] Appl. No.: 551,237

[22] Filed: Jul. 11, 1990

[30] Foreign Application Priority Data

Jan. 20, 1989 [JP] Japan ............................. 1-9924

[51] Int. Cl.⁵ .................... H01L 27/02; H01L 29/68; H01L 27/10; H01L 23/48
[52] U.S. Cl. .................................. 357/41; 357/23.6; 357/45; 357/68
[58] Field of Search ................... 357/23.6, 41, 45, 68

[56] References Cited

FOREIGN PATENT DOCUMENTS 1-179449 7/1989 Japan .

OTHER PUBLICATIONS

"3-Dimensional Stacked Capacitor Cell for 16M and 64M DRAMS", T. EMA et al, 592-IEDM 88, pp. 592–595, 596–599, Dec. 1988.

*Primary Examiner*—Mark Prenty
*Attorney, Agent, or Firm*—Armstrong, Nikaido, Marmelstein, Kubovcik & Murray

[57] ABSTRACT

A dynamic random access memory includes a semiconductor substrate having an active region including first and second diffusion regions of a transfer transistor, an insulating layer formed on the semiconductor substrate and having first and second contact holes, and a stacked capacitor having a storage electrode which is electrically coupled to the first diffusion region through the first contact hole formed in the insulating layer and an opposed electrode. The DRAM also includes a word line electrically isolated from the semiconductor substrate, and a bit line electrically isolated from the semiconductor substrate and electrically coupled to the second diffusion region through the second contact hole formed in the insulating layer. The second contact hole is substantially positioned at a center of the bit line. The word line has a bent portion located between the first and second contact holes so that the word line is separated from the second contact hole at a predetermined distance.

35 Claims, 9 Drawing Sheets

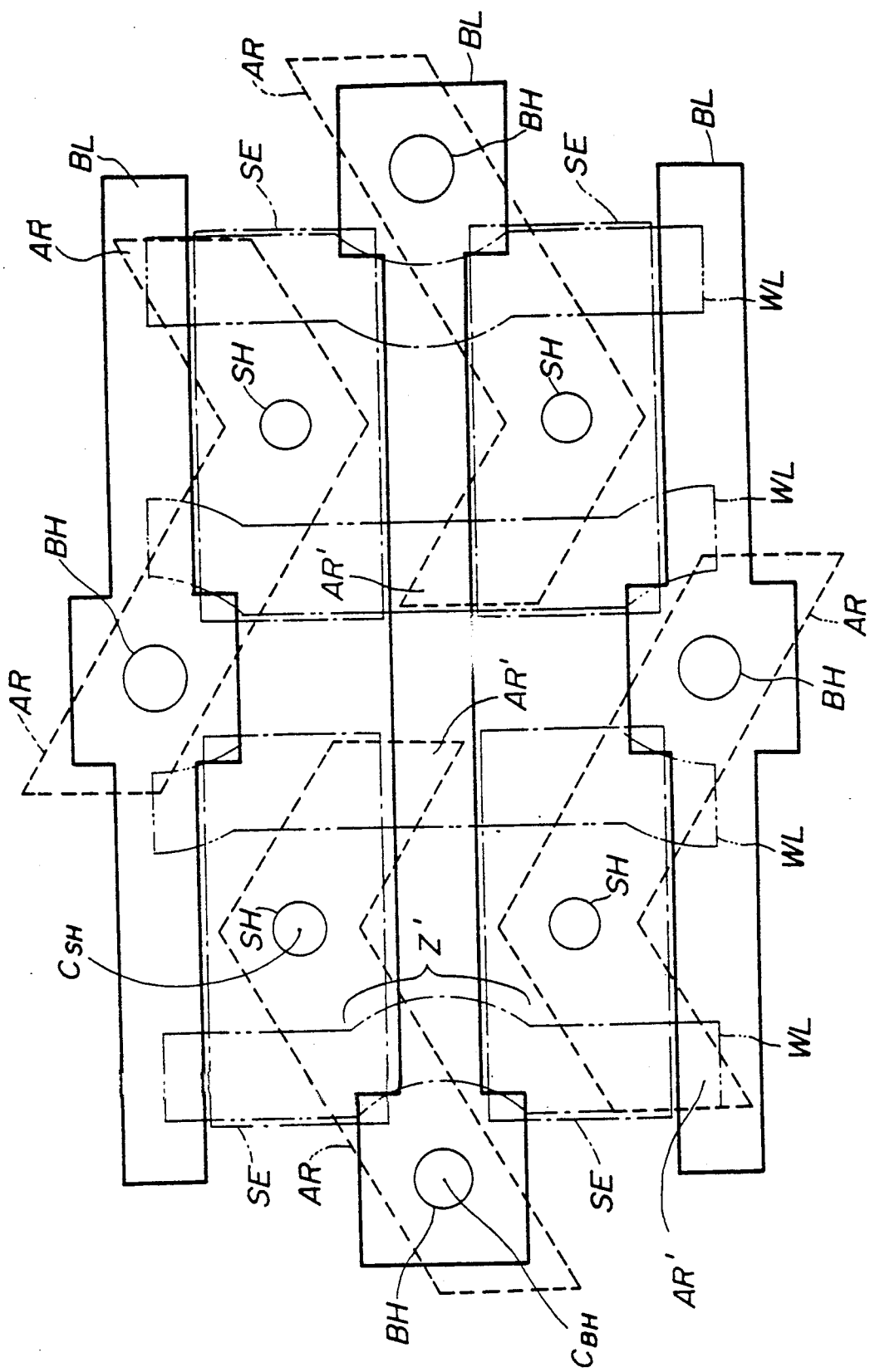

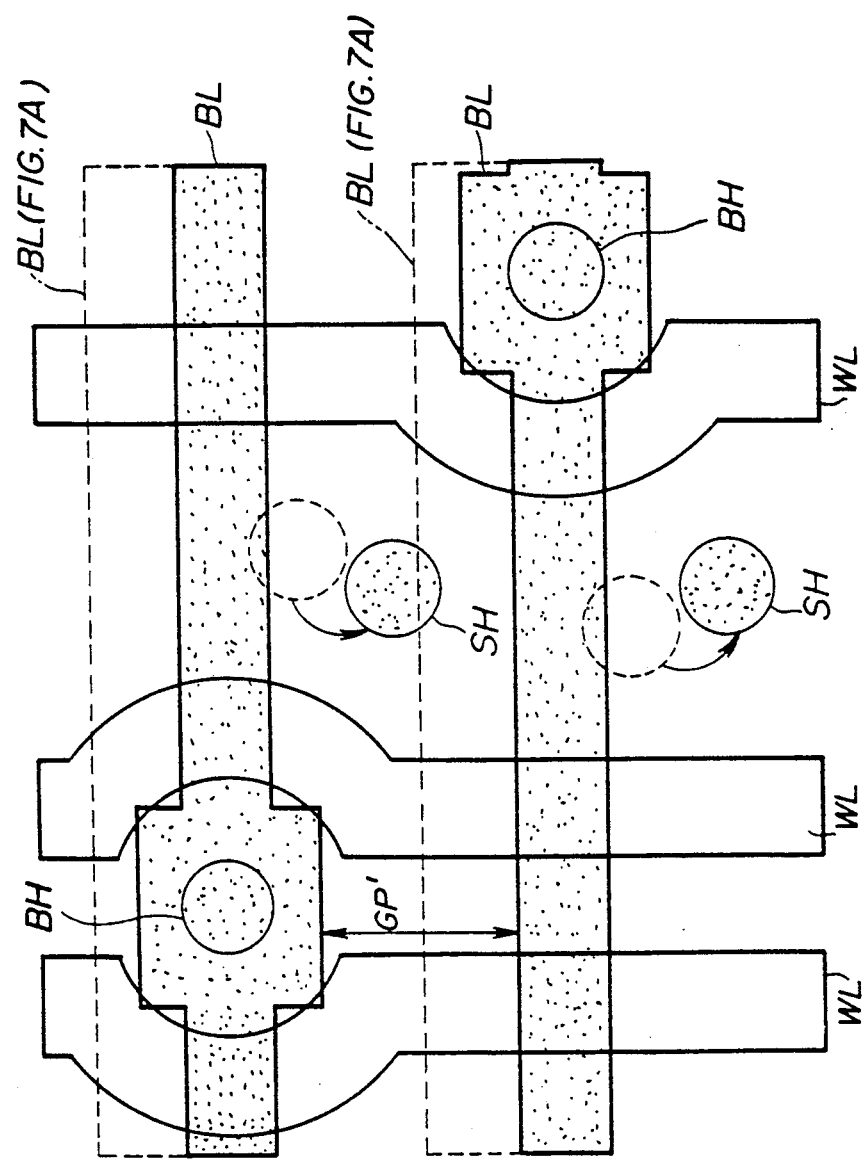

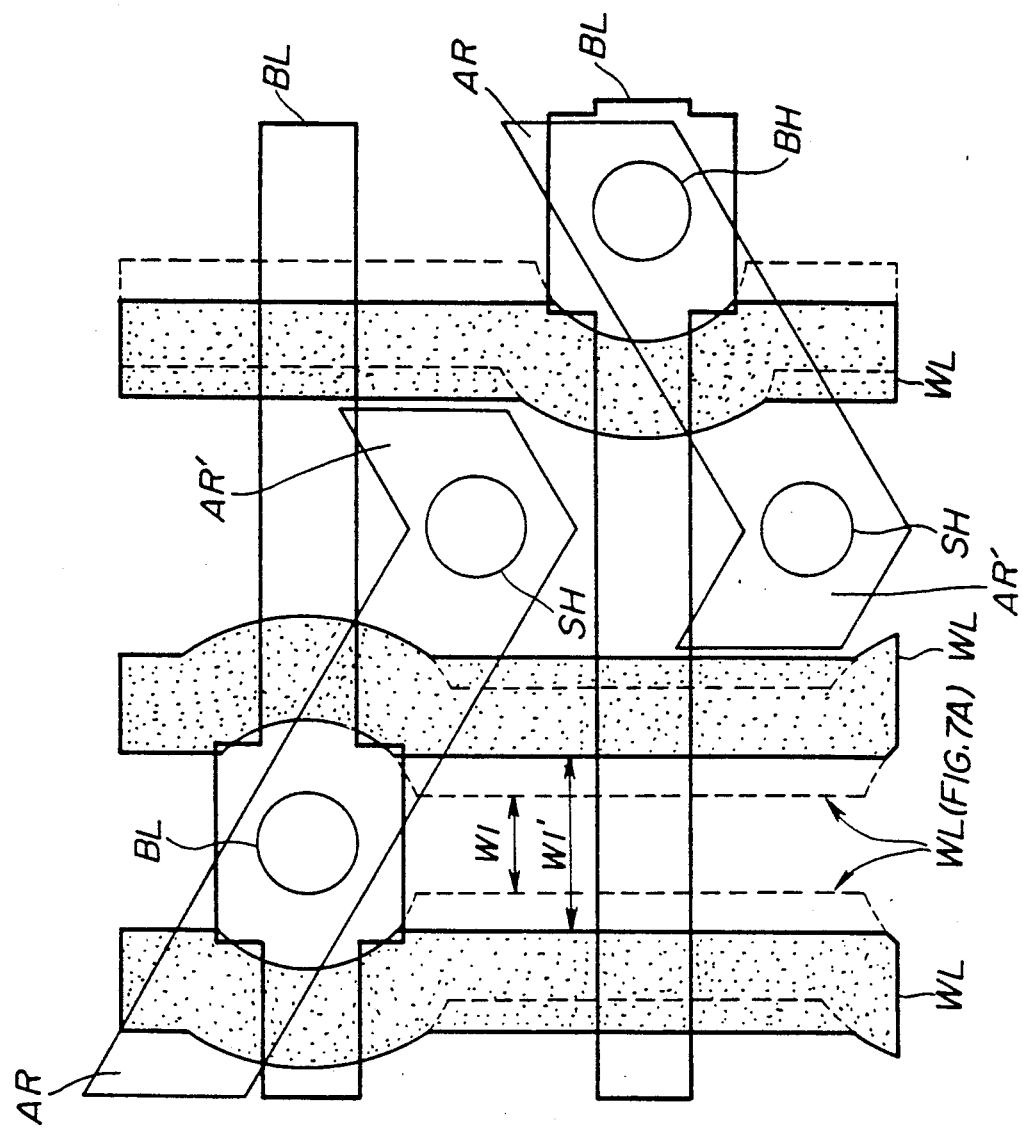

DYNAMIC RANDOM ACCESS MEMORY HAVING IMPROVED LAYOUT AND METHOD OF ARRANGING MEMORY CELL PATTERN OF THE DYNAMIC RANDOM ACCESS MEMORY

BACKGROUND OF THE INVENTION

The present invention generally relates to a dynamic random access memory, and more particularly to a dynamic random access memory having an improved layout. Further, the present invention is concerned with a method of arranging a memory cell pattern of the dynamic random access memory.

Recently, the layout of structural elements of a dynamic random access memory (hereinafter simply referred to as a DRAM) has been designed by using a computer. In order to reduce the amount of data to be processed, the layout is designed by using straight lines extending in two orthogonal directions and straight lines extending at an angle of 45° with respect to each of the orthogonal directions. However, advanced computers has an ability to process an extremely large amount of data at high speeds and thus makes it possible to design the layout by using oblique lines which extend at angles other than 45° with respect to the aforementioned orthogonal directions.

Referring to FIG. 1, there is illustrated a layout of a DRAM of a stacked capacitor type. In FIG. 1, AR indicates an active (diffusion) region including a drain region and a source region, a word line and S indicates a source area. D indicates a drain area. WL indicates a word line and WL' denotes the distance between the adjacent word lines WL. BL indicates a bit line and BL' indicates an extension portion of the bit line BL. BH indicates a bit line contact hole and SE indicates a storage electrode. SH indicates a storage electrode contact hole. GP is the space between the extension portion BL' of the bit line BL and the adjacent bit line BL.

FIG. 2 is a sectional view taken along line II-II shown in FIG. 1. A P-type silicon semiconductor substrate 1 has a source region S and drain region D of a transfer transistor, both of which are active regions (impurity diffused regions) buried in the Si substrate 1. A field insulating layer 2 and a gate insulating layer 3 are formed on the Si substrate 1. CP indicates an opposed electrode (cell plate) of a storage capacitor. The bit line BL is formed at a layer level lower than that of the opposed electrode CP. The word line WL' the bit line BL' the storage electrode SE and the opposed electrode CP are stacked in this order. A stacked capacitor is composed of the storage electrode SE, a dielectric film DE and the cell plate CP. This arrangement would become popular as the size of memory cells is further reduced.

In the arrangement shown in FIGS. 1 and 2, each bit line contact hole BH used for electrically coupling the bit line BL and the source region S of the transfer transistor must be positioned so that it keeps away from the word line WL. The storage electrode contact hole SH used for electrically coupling the storage electrode SE and the drain region D of the transfer transistor must be positioned so that it keeps away from both the word line WL and the bit line BL.

Each bit line BL must be provided with the extension portion BL' which is formed so that it surrounds the contact hole BH. The presence of the extension portion BL' increases the surface area of the bit line BL so that a parasitic capacitance is increased. In addition, the arrangement shown in FIGS. 1 and 2 causes short circuiting in the vicinity of the bit line extension portion BL', since the distance GP between the bit line extension portion BL' and the adjacent bit line BL is smaller than the distance between the adjacent bit lines BL.

Length DM of each memory cell measured in the direction in which each bit line BL extends is described as follows.

$$\begin{aligned} DM &= a + e + d + e + 2c + e + d + \tfrac{1}{2}WL' \\ &= A + c + e + d + \tfrac{1}{2}WL' \end{aligned}$$

where
- a: half the width of the bit line contact hole BH
- e: alignment margin of each of the contact holes
- d: the width of the word line WL
- c: half the width of the storage electrode contact hole SH
- WL' the distance between the adjacent word lines WL It can be seen from FIG. 1 that $A = a+e+d+e+c = a+c+d+2e$. The bit line contact hole BL and the storage electrode contact hole SH are arranged approximately in a line so that the length DM of each memory cell is great.

SUMMARY OF THE INVENTION

It is a general object of the present invention to provide a DRAM having an improved layout in which the aforementioned disadvantages are eliminated.

A more specific object of the present invention is to provide a DRAM having an improved layout which has no bit line extension portion for forming a bit line contact hole and which is directed to preventing the occurrence of short circuiting between the adjacent bit lines.

The above-mentioned objects of the present invention are a dynamic random access memory comprising: a semiconductor substrate having an active region including first and second diffusion regions of a transfer transistor; an insulating layer formed on the semiconductor substrate and having first and second contact holes; a stacked capacitor having a storage electrode which is electrically coupled to the first diffusion region through the first contact hole formed in the insulating layer and an opposed electrode; a word line electrically isolated from the semiconductor substrate; and a bit line electrically isolated from the semiconductor substrate and electrically coupled to the second diffusion region through the second contact hole formed in the insulating layer. The second contact hole is substantially positioned at a center of the bit line. The word line has a bent portion located between the first and second contact holes so that the word line is separated from the second contact hole at a predetermined distance.

The aforementioned objects of the present invention are also achieved by a dynamic random access memory comprising: a semiconductor substrate having a plurality of active regions, each including first and second diffusion regions of a transfer transistor; an insulating layer formed on the semiconductor substrate and having a plurality of first contact holes and a plurality of second contact holes; a plurality of stacked capacitors, each having a storage electrode which is electrically coupled to a corresponding one of the first diffusion regions through a corresponding one of the first contact holes formed in the insulating layer and an opposed electrode; a plurality of word lines electrically isolated from the semiconductor substrate; and a plurality of bit lines electrically isolated from the semiconductor substrate, each of the bit lines being electrically coupled to a corresponding one of the second diffusion regions through a corresponding one of the second contact holes formed in the insulating layer. Each of the second contact holes is substantially positioned at a center of a corresponding one of the bit lines. Each of the word lines having a bent portion located between a corresponding one of the first contact holes and a corresponding one of the second contact holes so that a corresponding one of the word lines is separated from the corresponding one of the second contact holes at a predetermined distance.

Another object of the present invention is to provide a method of arranging a memory cell pattern of the above-mentioned dynamic random access memory.

This object of the present invention is achieved by a method of arranging structural elements of a dynamic random access memory including a semiconductor substrate having first and second diffusion regions, an insulating layer having first and second contact holes, a word line, a bit line and a stacked capacitor having a storage electrode, wherein the storage electrode is in contact with the first diffusion region through the first contact hole, and the bit line is in contact with the second diffusion region through the second contact hole, the method comprising the steps of determining a first position which is separated from a center of the bit line at a first predetermined distance; determining a second position which is located at the center of the bit line and which is separated from the first position at a second predetermined distance, and determining a position of the word line so that the word line is located between the first and second contact holes. The first position corresponds to a center of the first contact hole. The second position corresponds to a center of the second contact hole.

The above object of the present invention is also achieved by a method comprising the steps of determining a first position which is located at a center of the bit line, determining a second position which is located on an imaginary line extending from the first position at a predetermined angle with respect to the bit line and which is separated from the center of the bit line at a predetermined distance, and determining a position of the word line so that the word line is positioned between the first and second contact holes. The first position corresponds to a center of the second contact hole. The second position corresponds to a center of the first contact

BRIEF DESCRIPTION OF THE DRAWINGS

Other objects, features and advantages of the present invention will become apparent from the following detailed description when read in conjunction with the accompanying drawings, in which:

FIG. 6 is a diagram of a pattern according to the embodiment of the present invention in which four memory cells are illustrated;

FIGS. 7A, 7B and 7C are diagrams illustrating how the present invention was made.

DESCRIPTION OF THE PREFERRED EMBODIMENTS

The present invention is based on the following considerations.

First, in order to eliminate the aforementioned extension portion BL' which projects from the bit line BL and which surrounds the bit line contact hole BH, it is the best way to arrange the bit line contact hole BL so that the center thereof is positioned on the center line of the bit line BL.

Second, it is advantageous to arrange the storage electrode contact hole SH so that the center thereof is positioned at an equal distance from the adjacent bit lines BL and at an equal distance from the adjacent word lines WL.

Third, an imaginary line which connects the bit line contact hole BH and the corresponding storage electrode contact hole SH crosses the bit line BL at an angle with respect to the direction in which the bit line BL extends, that is, the center line thereof. Active regions such as source and drain regions are arranged on the basis of the imaginary line. In addition, the shape of each word line WL is determined, taking into consideration the pattern of the active regions.

Figure 1:
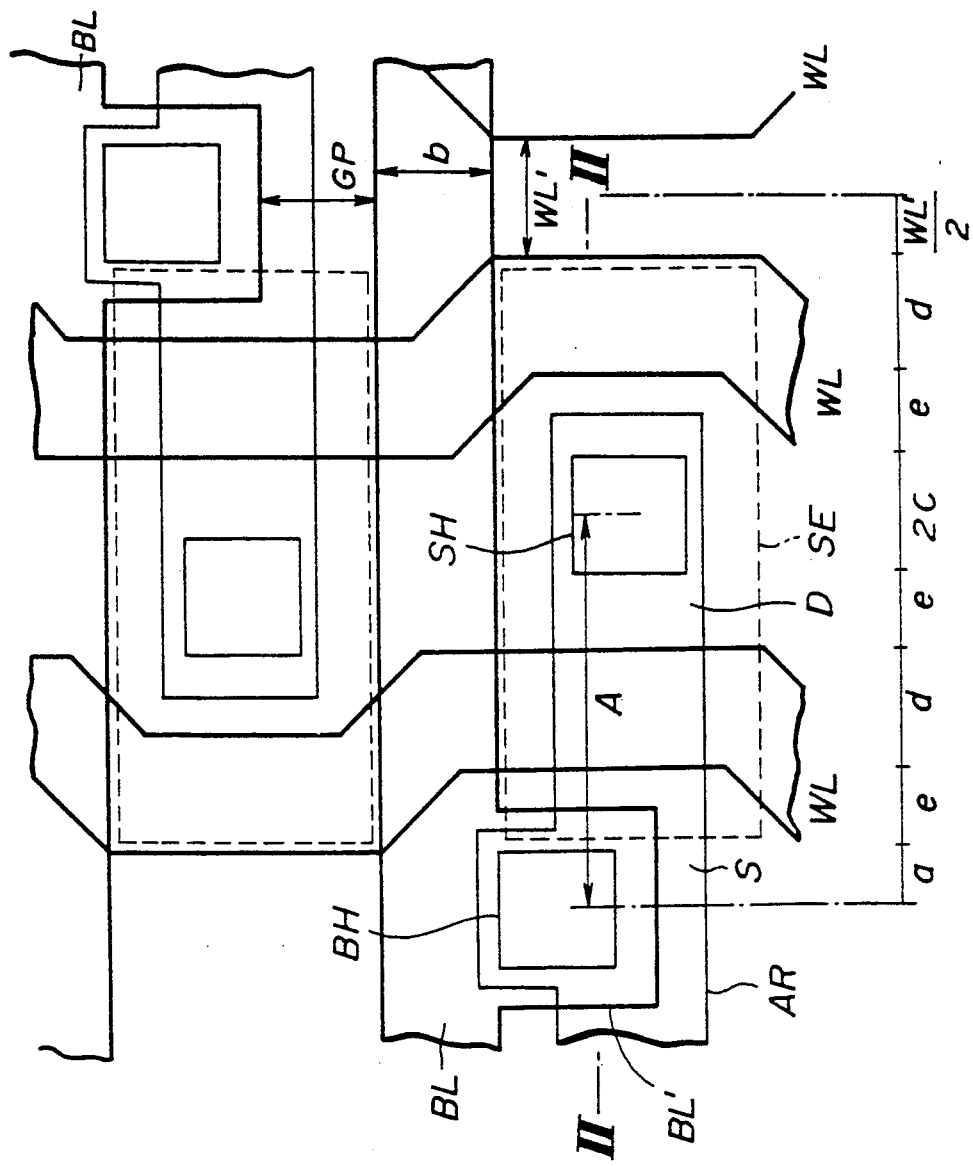
FIG. 1 is a diagram illustrating a conventional layout of a DRAM of a stacked capacitor type.
Figure 3:
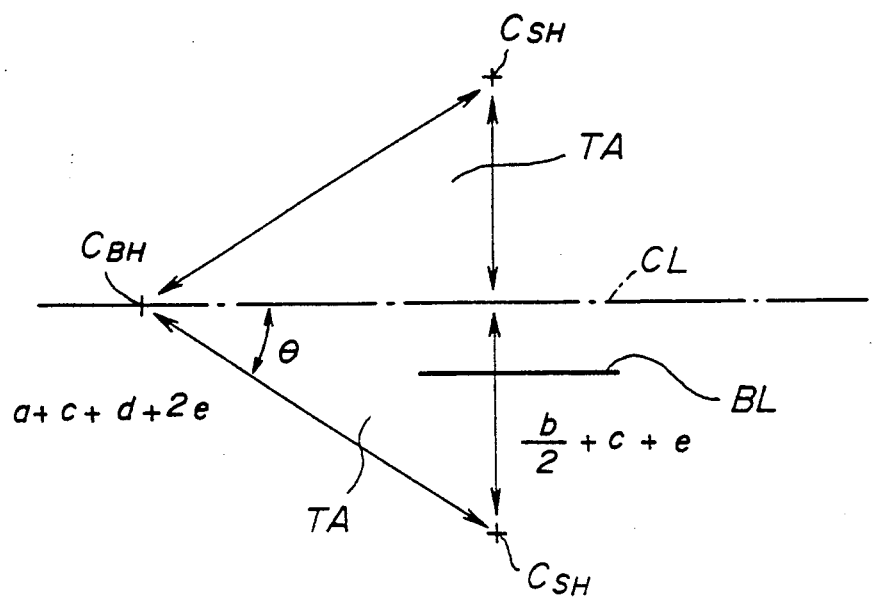
FIG. 3 is a diagram illustrating the principle of the present invention.

Referring to FIG. 3, there is illustrated the principle of the present invention based on the above-mentioned first to third considerations. In FIG. 3, those parts which have the same names of structural elements as those shown in FIG. 1 are given the same reference characters. CL indicates a center line of the bit line BL' and $C_{BH}$ indicates the center of the bit line contact hole BH. $C_{SH}$ indicates the center of the storage electrode contact hole SH, and $\theta$ indicates an angle formed between the center line CL and an imaginary line which connects the center $C_{BH}$ and $C_{SH}$.

A distance A between the center $C_{BH}$ of the bit line contact hole BH and the center $C_{SH}$ of the storage electrode contact hole SH, that is, the length A of the imaginary line therebetween is described as follows.

$$A = a + c + d + 2e$$

The distance between the center line CL of the bit line BL and the center $C_{SH}$ of the storage electrode contact hole BH is written as follows.

$$\tfrac{1}{2}b + c + e$$

It can be seen from FIG. 3 that two right-angled isosceles triangles TA are formed. Thus, the angle $\theta$ is written as follows.

$$\theta = \sin^{-1}[(\tfrac{1}{2}b + e - c)/(a + c + d + 2e)] \qquad (1)$$

The memory cell pattern is determined so that formula (1) is satisfied. It is possible to determine the memory cell pattern so that the angle $\theta$ is nearly equal to the right term of formula (1).

Figure 4:
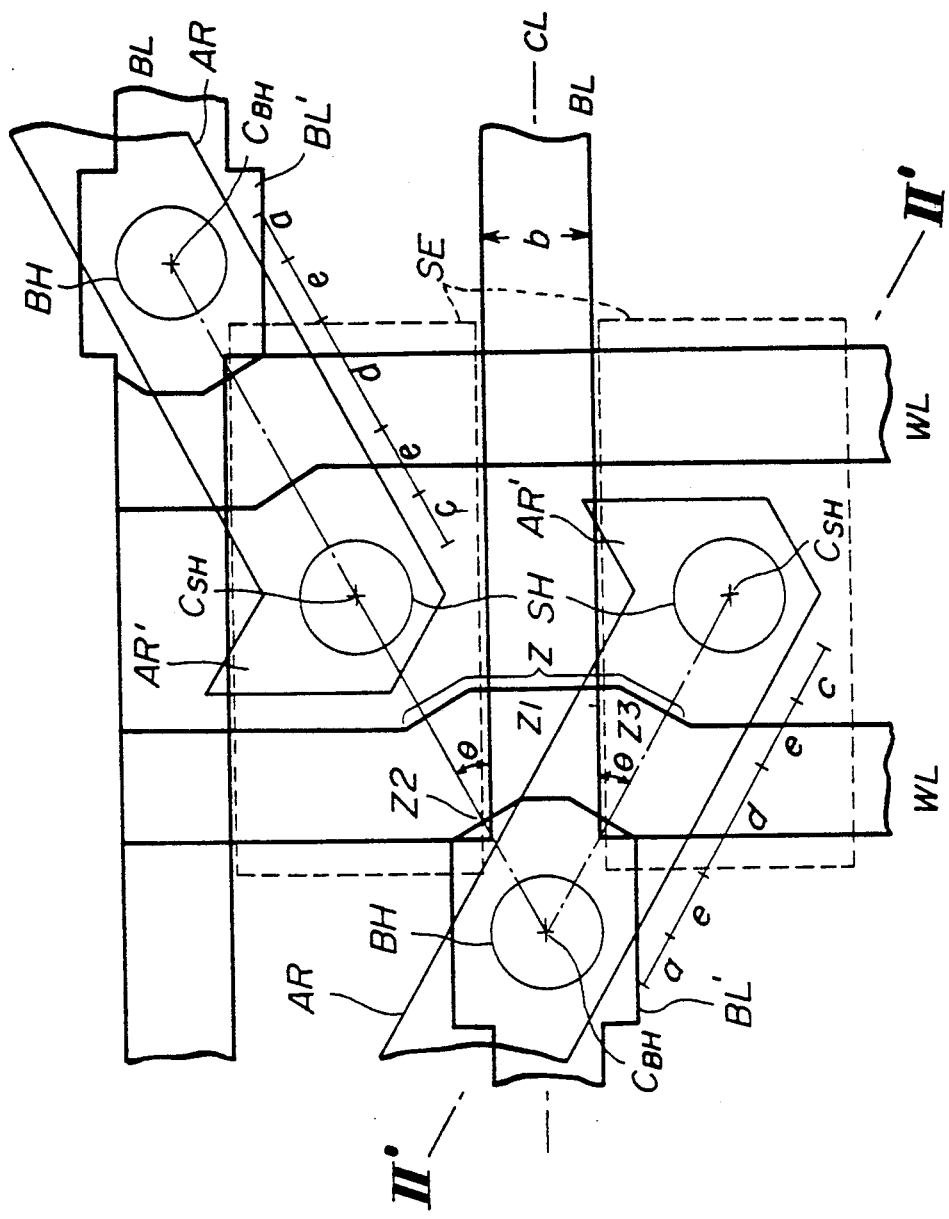
FIG. 4 is a diagram illustrating a pattern according to a preferred embodiment of the present invention.

Referring to FIG. 4, there is illustrated a layout of a DRAM according to a preferred embodiment of the present invention. In FIG. 4, those parts which have the same names as those shown in the previous figures are given the same reference characters. In FIG. 4, a letter b denotes the width of the bit line BL' and AR, indicates a bent portion of the active region AR. Z is a bent portion of the word line WL. Z1, Z2 and Z3 indicate areas of the word line WL which form the bent portion Z of the word line WL.

The center $C_{BH}$ of the bit line contact hole BH is positioned on the center line CL of the bit line BL. Although the bit line BL shown in FIG. 4 has an extension portion for forming the bit line contact hole BH, it is smaller than that shown in FIG. 1. Thus, the distance between the extension portion of the bit line BL and the adjacent bit line BL is increased so that the occurrence of short circuiting therebetween can be reduced.

The length A of the imaginary line which connects the center $C_{BH}$ of the bit line contact hole BH and the center $C_{SH}$ of the storage electrode contact hole SH is equal to $a+c+d+2e$, as described previously. The angle $\theta$ of the line with respect to the center line CL of the bit line BL is selected, as defined by formula (1). The minimum distance between the center $C_{SH}$ of the storage electrode contact hole SH and the center line CL of the bit line BL is equal to $\frac{1}{2}b+c+e$.

The active area AR extends along the imaginary line which connects the center $C_{BH}$ of the bit line contact hole BH and the center $C_{SH}$ of the storage electrode contact hole SH. That is, the active area AR is arranged obliquely with respect to the bit line BL. The active area AR has a bent portion AR' which is symmetrically bent or curved with respect to a line which passes through the center $C_{SH}$ of the storage electrode contact hole SH and which is perpendicular to the center line CL of the bit line BL.

Figure 5A:
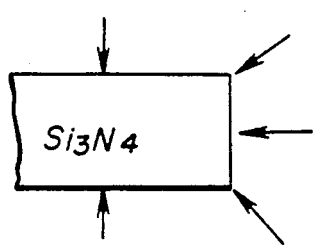
FIGS. 5A and 5B are diagrams illustrating the influence of a bird's beak.
Figure 5B:
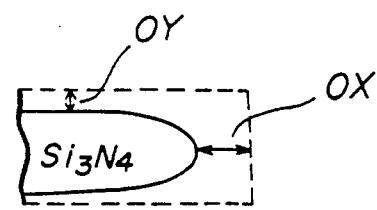

The bent portion AR' of the active area AR reduces the influence of bird's beaks. Referring to FIG. 5A, there is illustrated a silicon nitride ($Si_3N_4$) film used for selectively oxidizing the Si substrate to thereby produce an oxide layer (field insulating layer) for element-to-element isolation. Oxygen is supplied with a short end of the $Si_3N_4$ film along various directions, as shown by arrows in FIG. 5A. Thus, the bird's beak occurs at the short end of the $Si_3N_4$ film and an Si substrate surface portion in the vicinity of the short end is oxidized, as indicated by arrow OX shown in FIG. 5B. Although an Si substrate surface portion in the vicinity of a long end of the $Si_3N_4$ is also oxidized, as indicated by arrow OY shown in FIG. 5B, it is smaller than that indicated by the arrow OX. The bent portion AR, of the active region AR is provided for taking into account the occurrence of the above-mentioned bird's beak. It should be noted that it is impossible to provide a bent portion which straight extends from the active area AR because of the presence of the bit line contact hole BH.

The direction in which each word line WL extends is perpendicular to the direction in which each bit line BL extends. Each word line WL has the bent portion Z, which is composed of the areas Z1, Z2 and Z3. The area Z1 is orthogonal to the center line CL of the bit line CL. The areas Z2 and Z3 are located on both sides of the area Z1. Each of the areas Z2 and Z3 is orthogonal to the corresponding line which connects the center $C_{BH}$ of the bit line contact hole BH and the center $C_{SH}$ of the storage electrode contact hole SH. The areas Z2 and Z3 are arranged symmetrically with the area Z1.

According to the layout shown in FIG. 4, the length L of each memory cell measured in the direction in which the bit line BL extends is as follows.

$$L = 2 \times \sqrt{(a + c + d + 2e)^2 - (\tfrac{1}{2}b + c + e)^2}$$

It can be seen from the above formula that the length L of memory cell is not based on the distance WL' between the adjacent word lines. As a result, it is possible o to increase the distance WL' and reduce the possibility of the occurrence of short circuiting.

When the minimum distance between the adjacent lines is 0.5 [μm], the parameters are selected as follows.
a=c=0.3 [μm]
b=d=0.5 [μm]
e=0.4 [μm]
WL'=0.5 [μm]

In this case, the length of each memory cell in the direction in which the bit line BL extends is 3.29 [μm]. On the other hand, the length of each memory in the same direction according to the aforementioned prior arrangement shown in FIG. 1 is 3.35 [μm] when the distance between the adjacent word lines is set equal to 0.5 [μm].

The distance between the adjacent word lines according to the arrangement shown in FIG. 4 is 0.8 [μm]. On the other hand, the distance between the adjacent word lines according to the prior arrangement shown in FIG. 1 is 0.5 [μm].

The distance between the adjacent bit lines according to the arrangement shown in FIG. 4 is 1.0 [μm]. On the other hand, the distance between the adjacent bit lines according to the prior arrangement shown in FIG. 4 is 0.5 [μm].

The area of each memory cell according to the arrangement shown in FIG. 4 is slightly less than that shown in FIG. 1. The distance between the adjacent bit lines BL and the word lines WL in the memory cells is 1.6–2 times that of the prior arrangement.

Figure 2:
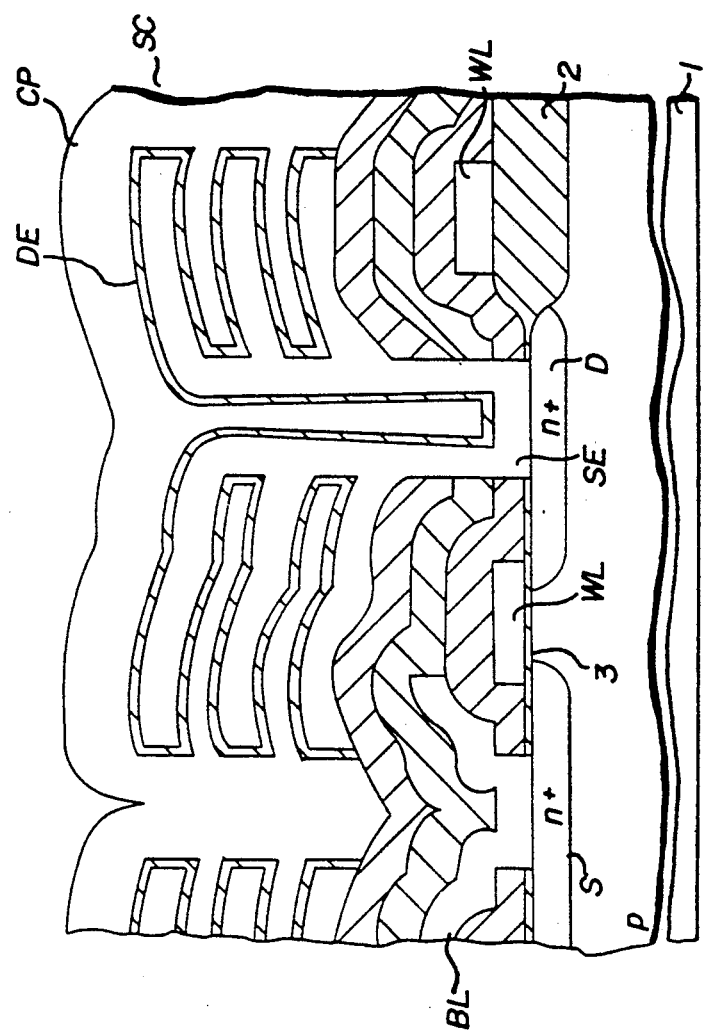
FIG. 2 is a cross sectional view taken along line II-II shown in FIG. 1.

The cross section taken along line II'-II' is almost the same as that shown in FIG. 2. The stacked capacitor is not limited to the structure shown in FIG. 2. For example, it is possible to form the stacked capacitor so that the storage electrode SE has a single fin. It is also possible to form the stacked capacitor so that the single fin or the lowermost fin from among a plurality of fins is separated from the insulating layer and the opposed electrode is also provided between the single fin or the lowermost fin and the insulating layer.

FIG. 6 is a diagram showing the layout of four memory cells. In FIG. 6, those parts which are the same as those in the previous figures are given the same reference numerals. It will be noted that the bent portion AR' of each active area AR shown in FIG. 6 is greater than that shown in FIG. 4. That is, the bent portion AR' of each active area AR is located under the corresponding word line WL. It will also be noted that a curved part Z' of each word line WL which crosses the bit line BL is curved without having the areas Z1, Z2 and Z3. Even in the arrangement shown in FIG. 6, the imaginary line connecting the center $C_{BH}$ of the bit line contact hole BH and the center $C_{SH}$ of the storage electrode contact hole $C_{SH}$ is perpendicular to the curved part Z' of the word line WL. All of memory cell patterns can be formed by repeatedly arranging the layout shown in FIG. 6.

Figure 7A:
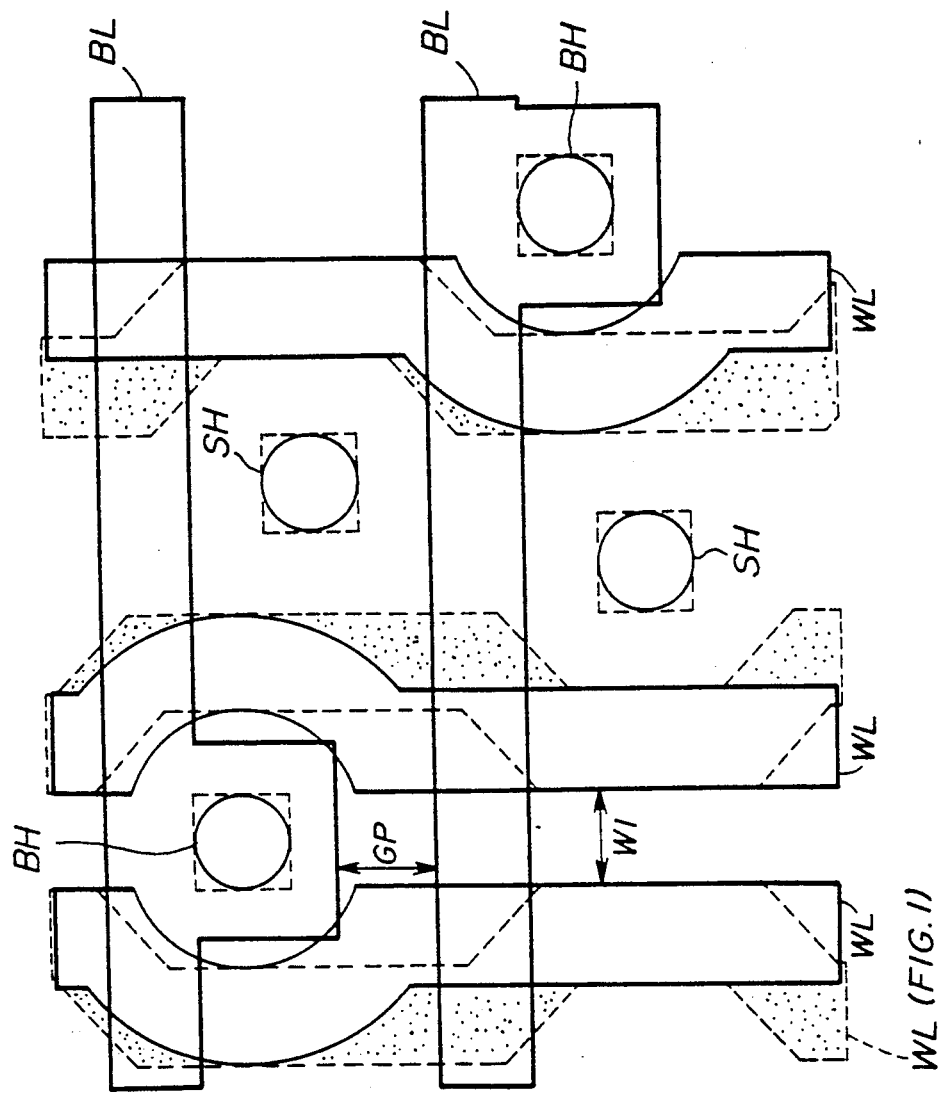
Figure 8:
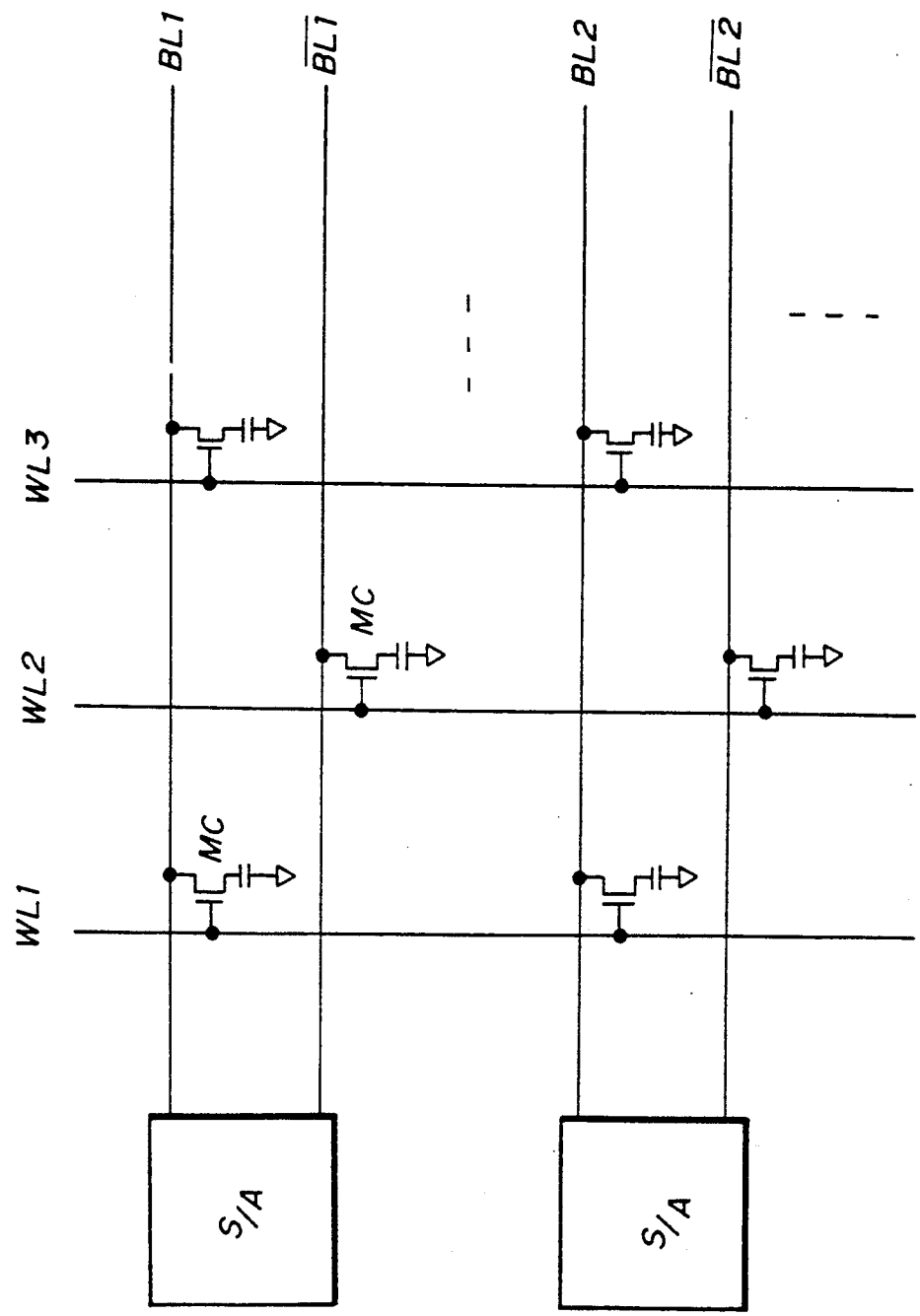
FIG. 8 is a block diagram of a folded bit line type DRAM.

FIGS. 7A, 7B and 7C are diagrams illustrating how the present invention was made. In FIGS. 7A through 7C, those parts which have the same names as those described previously are given the same reference letters. Referring to FIG. 7A, the dot line illustrates the pattern of the conventional word line WL as shown in FIG. 1. A contact hole formed in a fine pattern is approximately of a circle shape due to the intensity distribution of light. Thus, it is possible to consider each contact hole as a circle on the pattern layout drawing. The word lines are required to be separated from the bit line contact holes BH at a predetermined distance. Thus, it is possible to partially shape each word line WL into a circular arc in order to keep away from the bit line contact holes BH at the predetermined distance. As a result, dot areas between the adjacent word lines WL become available. Thus, as shown in FIG. 7B, it becomes possible to obliquely shift the positions of the storage electrode contact holes SH. Due to the positional change in the storage electrode contact holes SH, it becomes possible to shift the positions of the bit lines BL so that the bit line contact holes BH are located at the center thereof, as shown in FIG. 7B. Thereby, it is possible to substantially eliminate the bit line extension portions as shown in FIG. 1 or FIG. 7A so that each bit line BL is substantially straight. In addition, it is possible to increase the distance between the adjacent bit lines BL from GP (FIG. 7A) to GP' (FIG. 7B). Further, due to this positional change of the storage electrode contact holes SH, it becomes possible to shift the positions of the word lines WL' as illustrated in FIG. 7C. As a result, it becomes possible to increase the distance between the opposite edges of the adjacent word lines WL from W1 to W1', as shown in FIG. 7C. On the other hand, the distance between the other opposite ends of the adjacent word lines WL is decreased, as shown in FIG. 7C. It is possible to arbitrarily determine the distances W1' and W2' on the basis of various requirements. Moreover, FIG. 8 is a block diagram of a folded bit line type DRAM. A plurality of pairs of bit lines, such as BL1 and $\overline{BL1}$, extend from corresponding sense amplifiers S/A. A plurality of word lines extend so as to cross the bit lines, as described previously. A memory cell MC is coupled between one of the bit lines and one of the word lines. The pattern arrangements according to the present invention are suitable for the folded bit line type DRAM as shown in FIG. 8. However, the arrangements are also applied to an open bit line type DRAM.

The present invention is not limited to the memory cell shown in FIG. 2, but includes memory cells as disclosed in U.S. Pat. Nos. 4,641,166, 4,649,406, 4,754,313 and 4,190,566 and U.S. Ser. Nos. 206,791 filed on June 15, 1988 and 274,279 filed on Nov. 21, 1988, the disclosure of which is hereby incorporated by reference.

The present invention is not limited to the specifically disclosed embodiments, and variations and modifications may be made without departing from the scope of the present invention.

What is claimed is:

1. A dynamic random access memory comprising:
   a semiconductor substrate having an active region including first and second diffusion regions of a transfer transistor;
   an insulating layer formed on said semiconductor substrate and having first and second contact holes;
   a stacked capacitor having a storage electrode which is electrically coupled to said first diffusion region through said first contact hole formed in said insulating layer and an opposed electrode;
   a word line electrically isolated from said semiconductor substrate; and
   a bit line electrically isolated from said semiconductor substrate and electrically coupled to said second diffusion region through said second contact hole formed in said insulating layer,
   said second contact hole being approximately positioned at a center (CL) of said bit line, and
   said word line having a bent portion located between said first and second contact holes so that said word line is separated from said second contact hole at a predetermined distance.

2. A dynamic random access memory as claimed in claim 1, wherein said bent portion of the word line is arranged so that said bent portion is orthogonal to an imaginary line which connects a center of said first contact hole and a center of said second contact hole.

3. A dynamic random access memory as claimed in claim 1, wherein said active region is obliquely arranged with respect to said bit line and said word line.

4. A dynamic random access memory as claimed in claim 2, wherein said active region is arranged along said imaginary line.

5. A dynamic random access memory as claimed in claim 1, wherein said bent portion of the word line has an arc-shaped pattern.

6. A dynamic random access memory as claimed in claim 1, wherein:
   said bent portion of the word line has a first area, a second area and a third area which are integrally formed in this order;
   said second area is orthogonal to said bit line; and
   one of said first and second areas is orthogonal to an imaginary line which connects a center of said first contact hole and a center of said second contact hole.

7. A dynamic random access memory as claimed in claim 6, wherein said first and third areas are arranged in symmetry with each other about said second 8. A dynamic random access memory as claimed in claim 1, wherein said active region comprises a bent active portion extending toward said bit line.

9. A dynamic random access memory as claimed in claim 1, wherein said active region comprises a bent active portion which is bent at a center of said first contact hole and which extends toward said bit line.

10. A dynamic random access memory as claimed in claim 9, wherein:
   said active region comprises a straight portion integrally formed with said bent active portion thereof; and
   said bent active portion of the active region is partially in symmetry with said straight portion about said center of the first contact hole.

11. A dynamic random access memory as claimed in claim 8, wherein said bent active portion of the active region has an end which is located below said bit line.

12. A dynamic random access memory as claimed in claim 8, wherein said bent active portion of the active region is obliquely arranged with respect to said bit line.

13. A dynamic random access memory as claimed in claim 1, wherein:
   an imaginary line which connects a center of said first contact hole and a center of said second contact hole is inclined at an angle $\theta$ with respect to a direction in which said bit line extends; and said angle $\theta$ is defined substantially as follows:

$$\theta = \sin^{-1}[(\tfrac{1}{2}b+e+c)/(a+c+d+2e)]$$

where
- a: half a width of the second contact hole,
- e: an alignment margin of each of said first and second contact holes,
- d: a width of the word line,
- c: half a width of said first contact hole, and
- b: a width of said bit line.

14. A dynamic random access memory as claimed in claim 1, wherein said first and second contact holes are substantially of circular shapes.

15. A dynamic random access memory as claimed in claim 1, wherein said first diffusion region is a drain region and said second diffusion region is a source region.

16. A dynamic random access memory as claimed in claim 1, wherein said bit line is formed at a layer level lower than that of said opposed electrode.

17. A dynamic random access memory comprising:
a semiconductor substrate having a plurality of active regions, each including first and second diffusion regions of a transfer transistor;
an insulating layer formed on said semiconductor substrate and having a plurality of first contact holes and a plurality of second contact holes;
a plurality of stacked capacitors, each having a storage electrode which is electrically coupled to a corresponding one of the first diffusion regions through a corresponding one of the first contact holes formed in said insulating layer and an opposed electrode;
a plurality of word lines electrically isolated from said semiconductor substrate; and
a plurality of bit lines electrically isolated from said semiconductor substrate, each of said bit lines being electrically coupled to a corresponding one of said second diffusion regions through a corresponding one of the second contact holes formed in said insulating layer,
each of said second contact holes being approximately positioned at a center of a corresponding one of the bit lines, and
each of said word lines having a bent portion located between a corresponding one of the first contact holes and a corresponding one of the second contact holes so that a corresponding one of the word lines is separated from said corresponding one of the second contact holes at a predetermined distance.

18. A dynamic random access memory as claimed in claim 17, wherein:
each of said first contact holes is located at an almost equal distance from two adjacent word lines from among said plurality of word lines;
each of said first contact holes is located at an almost equal distance from two adjacent bit lines from among said plurality of bit lines.

19. A dynamic random access memory as claimed in claim 17, wherein said bent portion of each of the word lines is arranged so that said bent portion is orthogonal to an imaginary line which connects a center of said corresponding one of the first contact holes and a center of said corresponding one of the second contact holes.

20. A dynamic random access memory as claimed in claim 17, wherein each of said active regions is obliquely arranged with respect to said bit lines and said word lines.

21. A dynamic random access memory as claimed in claim 19, wherein each of said active regions is arranged along said imaginary line.

22. A dynamic random access memory as claimed in claim 17, wherein said bent portion of each of the word lines has an arc-shaped pattern.

23. A dynamic random access memory as claimed in claim 17, wherein each of said active regions comprises a bent active portion extending toward a corresponding one of the bit lines.

24. A dynamic random access memory as claimed in claim 17, wherein each of said active regions comprises a bent active portion which is bent at a center of a corresponding one of the first contact holes and which extends toward a corresponding one of the bit lines.

25. A dynamic random access memory as claimed in claim 24, wherein:
each of said active regions comprises a straight portion integrally formed with said bent active portion thereof; and
said bent active portion of each of the active regions is partially in symmetry with said straight portion about said center of said corresponding one of the first contact holes.

26. A dynamic random access memory as claimed in claim 23, wherein said bent active portion of each of said active regions has an end which is located below a corresponding one of the bit lines.

27. A dynamic random access memory as claimed in claim 23, wherein said bent active portion of each of said active regions is obliquely arranged with respect to a corresponding one of the bit lines.

28. A dynamic random access memory claimed in claim 17, wherein:
an imaginary line which connects a center of said corresponding one of the first contact holes and a center of said corresponding one of the second contact holes is inclined at an angle $\theta$ with respect to a direction in which said bit lines extend; and
said angle $\theta$ is defined substantially as follows:

$$\theta = \sin^{-1}[((\tfrac{1}{2}b+e+c)/(a+c+d+2e)]$$

where
- a: half a width of each of the second contact holes,
- e: an alignment margin of each of said plurality of first and second contact holes,
- d: a width of the word lines,
- c: half a width of said first contact holes, and
- b: a width of said bit lines.

29. A dynamic random access memory as claimed in claim 17, wherein said pluralities of first and second contact holes are substantially of circular shapes.

30. A dynamic random access memory as claimed in claim 17, wherein each of said bit lines is formed at a layer level lower than that of each of said opposed electrodes.

31. A dynamic random access memory as claimed in claim 17, wherein said bit lines are of a folded-bit line type.

32. A method of arranging structural elements of a dynamic random access memory including a semiconductor substrate having first and second diffusion regions, an insulating layer having first and second contact holes, a word line, a bit line and a stacked capacitor having a storage electrode, wherein said storage electrode is in contact with said first diffusion region through said first contact hole, and said bit line is in contact with said second diffusion region through said second contact hole, said method comprising the steps of:

determining a first position which is separated from a center of said bit line at a first predetermined distance;

determining a second position which is located at the center of said bit line and which is separated from said first position at a second predetermined distance; and determining a position of said word line so that said word line is located between said first and second contact holes, wherein:

said first position corresponds to a center of said first contact hole; and said second position corresponds to a center of said second contact hole.

33. A method as claimed in claim 32, wherein:

said first predetermined distance is approximately equal to b/2+c+e where b is a width of said bit line, c is half a width of said first contact hole, d is a width of the word line, and e is an alignment margin of said first contact hole;

said second predetermined distance is approximately equal to a+c+d+2e where a is a half a width of said second contact hole.

34. A method of arranging structural elements of a dynamic random access memory including a semiconductor substrate having first and second diffusion regions, an insulating layer having first and second contact holes, a word line, a bit line and a stacked capacitor having a storage electrode, wherein said storage electrode is in contact with said first diffusion region through said first contact hole, and said bit line is in contact with said second diffusion region through said second contact hole, said method comprising the steps of:

determining a first position which is located at a center of said bit line;

determining a second position which is located on an imaginary line extend from said first position at a predetermined angle $\theta$ respect to said bit line and which is separated from the center of said bit line at a predetermined distance; and determining a position of said word line so that said word line is positioned between said first and second contact holes, wherein:

said first position corresponds to a center
contact hole; and said second position corresponds to a center of said first contact hole.

35. A method as claimed in claim 34, wherein:

said predetermined angle $\theta$ is defined substantially as follows:

$$\theta = sin^{-1}[(\tfrac{1}{2}b+e+c)/(a+c+d+2e)]$$

where a: half a width of said second contact hole, e: an alignment margin of each of said first and second contact holes, d: a width of said word line, c: half a width of said first contact hole, and b: a width of said bit line; and said predetermined distance is approximately equal to b/2+c+e.

* * * * *

UNITED STATES PATENT AND TRADEMARK OFFICE
CERTIFICATE OF CORRECTION

PATENT NO. : 5,014,103
DATED : May 7, 1991
INVENTOR(S) : Taili Ema

It is certified that error appears in the above-identified patent and that said Letters Patent is hereby corrected as shown below:

Column 8, claim 7,
Line 43, after "said second" insert -- area. --

Column 9, claim 13,
Line 5, change $\theta=\sin^{-1}(\frac{1}{2} b + e + c)/(a + c + d + 2e)]$" to be -- $\theta=\sin^{-1}[(\frac{1}{2} b + e + c)/(a + c + d + 2e)]$ --.

Column 10, claim 28,
Line 46, change $\theta=\sin^{-1}((\frac{1}{2} b + e + c)/(a + c + d + 2e)]$" to be -- $\theta=\sin^{-1}[(\frac{1}{2} b + e + c)/(a + c + d + 2e)]$ --.

Column 12, claim 34,
Line 16, after "a center" insert -- of said second --.

Signed and Sealed this

Twenty-sixth Day of February, 2002

Attest:

Attesting Officer

JAMES E. ROGAN
Director of the United States Patent and Trademark Office